United States Patent
Ker et al.

(10) Patent No.: US 7,253,453 B2
(45) Date of Patent: Aug. 7, 2007

(54) CHARGE-DEVICE MODEL ELECTROSTATIC DISCHARGE PROTECTION USING ACTIVE DEVICE FOR CMOS CIRCUITS

(75) Inventors: Ming-Dou Ker, Hsinchu (TW); Tang-Kui Tseng, Hsinchu (TW); Hsin-Chin Jiang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/442,261

(22) Filed: May 21, 2003

(65) Prior Publication Data

US 2004/0232492 A1    Nov. 25, 2004

(51) Int. Cl.
*H01L 21/336* (2006.01)

(52) U.S. Cl. ............... 257/173; 257/355; 257/356; 257/357; 257/360; 257/E27.014

(58) Field of Classification Search ......... 257/173, 257/355–357, 360, E27.014; 361/100–101
See application file for complete search history.

(56) References Cited

U.S. PATENT DOCUMENTS

| | | | | |
|---|---|---|---|---|
| 5,021,853 A | * | 6/1991 | Mistry | 257/357 |
| 5,587,598 A | * | 12/1996 | Hatanaka | 257/355 |
| 5,701,024 A | * | 12/1997 | Watt | 257/360 |
| 5,729,419 A | * | 3/1998 | Lien | 361/111 |
| 5,901,022 A | * | 5/1999 | Ker | 361/56 |
| 5,910,874 A | * | 6/1999 | Iniewski et al. | 361/56 |
| 6,064,093 A | * | 5/2000 | Ohta | 257/355 |
| 6,417,541 B1 | * | 7/2002 | Cai et al. | 257/328 |
| 6,437,407 B1 | * | 8/2002 | Ker et al. | 257/357 |
| 6,617,649 B2 | * | 9/2003 | Chang et al. | 257/355 |
| 6,682,993 B1 | * | 1/2004 | Wu et al. | 438/510 |
| 6,730,968 B1 | * | 5/2004 | Wu et al. | 257/355 |
| 7,078,283 B1 | * | 7/2006 | Wang | 438/197 |

* cited by examiner

*Primary Examiner*—Eugene Lee
(74) *Attorney, Agent, or Firm*—Akin Gump Strauss Hauer & Feld LLP

(57) ABSTRACT

An integrated circuit for providing electrostatic discharge protection that includes a contact pad, a CMOS device including a transistor having a substrate, and a CDM clamp for providing electrostatic discharge protection coupled between the contact pad and the CMOS device, the CDM clamp including at least one active device, wherein the CDM clamp conducts electrostatic charges accumulated in the substrate of the transistor to the contact pad and wherein the CMOS device is coupled between a high voltage line and a low voltage line.

31 Claims, 16 Drawing Sheets

CHARGE-DEVICE MODEL ELECTROSTATIC DISCHARGE PROTECTION USING ACTIVE DEVICE FOR CMOS CIRCUITS

RELATED APPLICATION

This application is related to U.S. patent application Ser. No. 10/230,055, entitled "ELECTROSTATIC DISCHARGE PROTECTION DEVICE AND METHOD OF MANUFACTURING THE SAME," filed on Aug. 29, 2002, U.S. patent application Ser. No. 10/230,287, entitled "ELECTROSTATIC DISCHARGE PROTECTION CIRCUIT WITH AN ACTIVE DEVICE," filed on Aug. 29, 2002, and U.S. patent application Ser. No. 09/749,377, entitled "SUBSTRATE-BIASED SILICON DIODE FOR ELECTROSTATIC DISCHARGE PROTECTION AND FABRICATION METHOD," filed on Dec. 28, 2000. The related applications are expressly incorporated herein by reference.

FIELD OF THE INVENTION

This invention pertains in general to circuits and methods for electrostatic discharge ("ESD") protection and, more particularly, to circuits and methods for a charged-device model ("CDM") ESD protection using active ESD devices.

BACKGROUND OF THE INVENTION

A semiconductor integrated circuit ("IC") is generally susceptible to an electrostatic discharge ("ESD") event, which may damage or destroy the IC. An ESD event refers to a phenomenon of electrical discharge of a current (positive or negative) for a short duration during which a large amount of current is provided to the IC. It is known that the susceptibility of a device to an ESD event may be determined by testing for one of three models, Human Body Model (HBM), Machines Model (MM), and Charged-Device Model (CDM).

The ESD Association Standard for the Development of an Electrostatic Discharge Control Program for Protection of Electrical and Electronic Parts, Assemblies and Equipment (Excluding Electrically Initiated Explosive Device), ANSI/ESD-S20.20-1999 (Aug. 4, 1999), provides for ESD sensitivity testings for each of the three models. The HBM model represents the discharge from the fingertip of a standing individual delivered to conductive leads of a device. FIG. 1 shows an HBM model ESD test circuit, modeled by a 100 picofarad (pF) capacitor, representing the effective capacitance of the human body, discharged through a switching component and 1,500 ohm series resistor, representing the effective resistance of the human body, into the device under tests. The discharge is a double exponential waveform with a rise time of 2-10 nanoseconds (nS) and a pulse duration of approximately 150 nS.

The MM model represents a rapid discharge from items such as a charged board assembly, charged cables, or the conduction arm of an automatic tester. The effective capacitance is approximately 200 pF discharged through a 500 nanohenry (nH) inductor directly into the device because the effective resistance of the machine is approximately zero. The discharge is a sinusoidal decaying waveform having a peak current of approximately 3.8 amperes (A) with a resonant frequency of approximately 16 MHz.

The CDM model is a phenomenon when a device acquires charge through frictional or electrostatic induction processes and then abruptly touches a grounded object or surface. Most of the charge is accumulated in a substrate, including a base, a bulk or a well, of the device, and is uniformly distributed in the substrate. Unlike the HBM model and the MM model, the CDM model includes situations where the device itself becomes charged and discharges to ground. The rise time is generally less than 200 picoseconds (pS), and the entire ESD event can take place in less than 2 nS. Current levels can reach several tens of amperes during discharge.

FIG. 2 is a plot showing the characteristics of HBM, MM and CDM discharges. Referring to FIG. 2, the CDM discharge reaches a peak current of approximately 15 A in less than 1 nS, and the discharge is complete within approximately 10 nS.

Many schemes have been implemented to protect an IC from the three types of ESD events. Examples of conventional ESD protection schemes include an HBM/MM ESD clamp and a CDM ESD clamp. FIG. 3 shows a scheme using a PMOS transistor Mp1$a$ and an NMOS transistor Mn1$b$ as a CDM ESD clamp to conduct electrostatic charges, accumulated in the substrate of transistors Mp5 or Mn5, to an input pad as the input pad is grounded. Incorporating transistors Mp1$a$ and Mn1$b$ into the scheme shown in FIG. 3 for CDM ESD protection is necessary because the HBM/MM ESD clamp is unable to respond to a CDM event in time before the accumulated CDM charge destroys a thin gate oxide of transistors Mn5 or Mp5.

FIG. 4 shows a scheme using diodes D1$a$, D1$b$, D2$a$ and D2$b$ as a CDM ESD clamp to conduct CDM charges, and having an HBM/MM ESD clamp similar to that shown in FIG. 3. The diodes are connected by different power lines for possible additional ESD discharging paths.

FIG. 5 is a reproduction of FIG. 8 of U.S. Pat. No. 5,901,022 (hereinafter "the '022 patent") to Ker, one of the inventors of the present invention, entitled "Charged Device Mode ESD Protection Circuit." The '022 patent discloses an ESD protection circuit having an HBM/MM ESD clamp that uses an inductor L to couple to an input stage including transistors Mp and Mn. Inductor L functions to protect the internal circuit from a CDM ESD event. Since inductor L may be disposed under an input pad, the layout area of the ESD protection circuit is not increased.

With the advance of semiconductor technology into a deep sub-micron era, the conventional ESD protection schemes, such as those described above, may no longer be effective in protecting gate oxides that are as thin as 4 naiiefes nanometers (tim) or less from a CDM ESD event. It is desirable to provide an CDM ESD protection circuit that is able to quickly conduct CDM charges to ground during a CDM ESD event.

SUMMARY OF THE INVENTION

Accordingly, the present invention is directed to ESD protection circuits and methods that obviate one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the circuits and methods particularly pointed out in the written description and claims thereof, as well as the appended drawings.

To achieve these and other advantages, and in accordance with the purpose of the invention as embodied and broadly described, there is provided an integrated circuit for providing electrostatic discharge protection that includes a contact pad, a CMOS device including a transistor having a substrate, and a CDM clamp for providing electrostatic discharge protection coupled between the contact pad and the CMOS device, the CDM clamp having at least one active device, wherein the CDM clamp conducts electrostatic charges accumulated in the substrate of the transistor to the contact pad and wherein the CMOS device is coupled between a high voltage line and a low voltage line.

In one aspect of the present invention, the CDM clamp is an n-type active device having one of low, zero, or negative threshold voltage.

In another aspect of the present invention, the CDM clamp is a p-type active device having one of low, zero, or positive threshold voltage.

Also in accordance with the present invention, there is provided an integrated circuit that includes a first voltage line, a second voltage line, a transistor having a gate coupled to the first voltage line and a substrate coupled to the second voltage line, and a CDM clamp coupled between the gate and the substrate of the transistor, the CDM clamp including at least one active device having a low threshold voltage, wherein the CDM clamp conducts electrostatic charges accumulated in the substrate of the transistor to one of the first voltage line or second voltage line during an ESD event.

Further in accordance with the present invention, there is provided an integrated circuit that includes a contact pad a transistor having a substrate, a CDM protection circuit comprising a CDM clamp coupled between the contact pad and the substrate of the transistor, the CDM clamp including at least one active device, and an HBM/MM protection circuit disposed between the contact pad and the CDM protection circuit comprising at least one HBM/MM clamp coupled to the contact pad, wherein the CDM clamp conducts electrostatic charges accumulated in the substrate of the transistor to the contact pad as the contact pad is grounded.

Still in accordance with the present invention, there is provided a method for providing electrostatic discharge protection that includes providing a contact pad, grounding the contact pad, providing a transistor having a substrate, providing an active device CDM clamp coupled between the contact pad and the substrate of the transistor, accumulating electrostatic charges in the substrate of the transistor, and conducting the accumulated electrostatic charges in the substrate of the transistor to the contact pad.

Yet still in accordance with the present invention, there is provided a method for providing electrostatic discharge protection that includes providing a contact pad, providing a transistor having a substrate, providing a CDM protection circuit including a CDM clamp coupled between the contact pad and the substrate of the transistor, the CDM clamp having at least one active device, providing an HBM/MM protection circuit disposed between the contact pad and the CDM protection circuit comprising at least one HBM/MM clamp coupled to the contact pad, and conducting electrostatic charges accumulated in the substrate of the transistor to the contact pad as the contact pad is grounded.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

Figure 1:
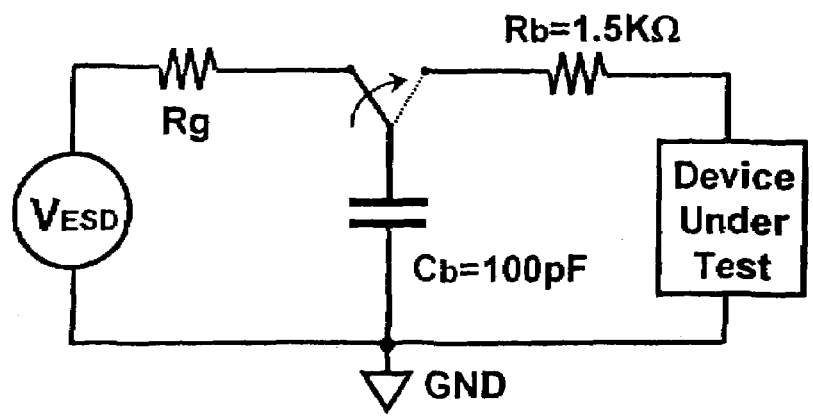
FIG. 1 shows a human body model ESD test circuit.
Figure 2:
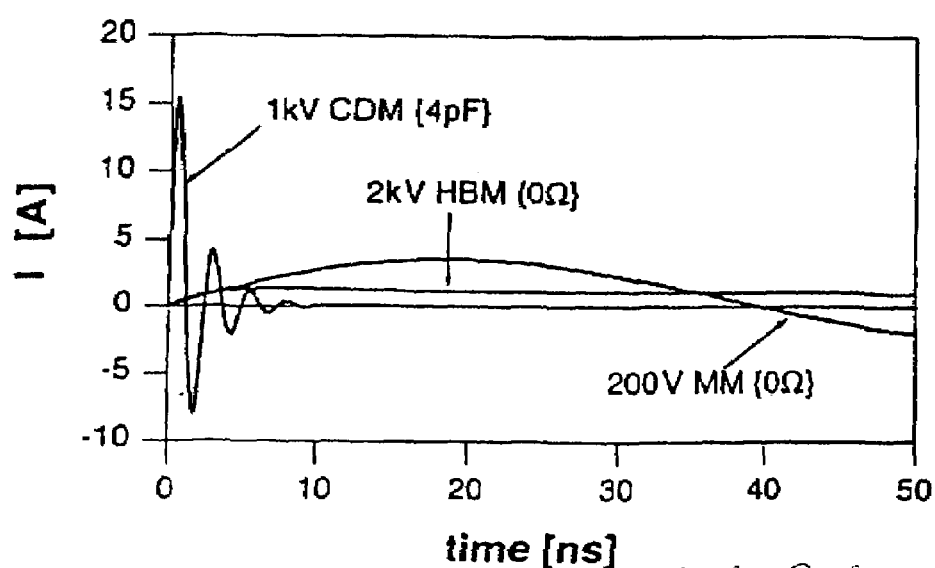
FIG. 2 is a plot that shows the characteristics of different types of ESD models.
Figure 3:
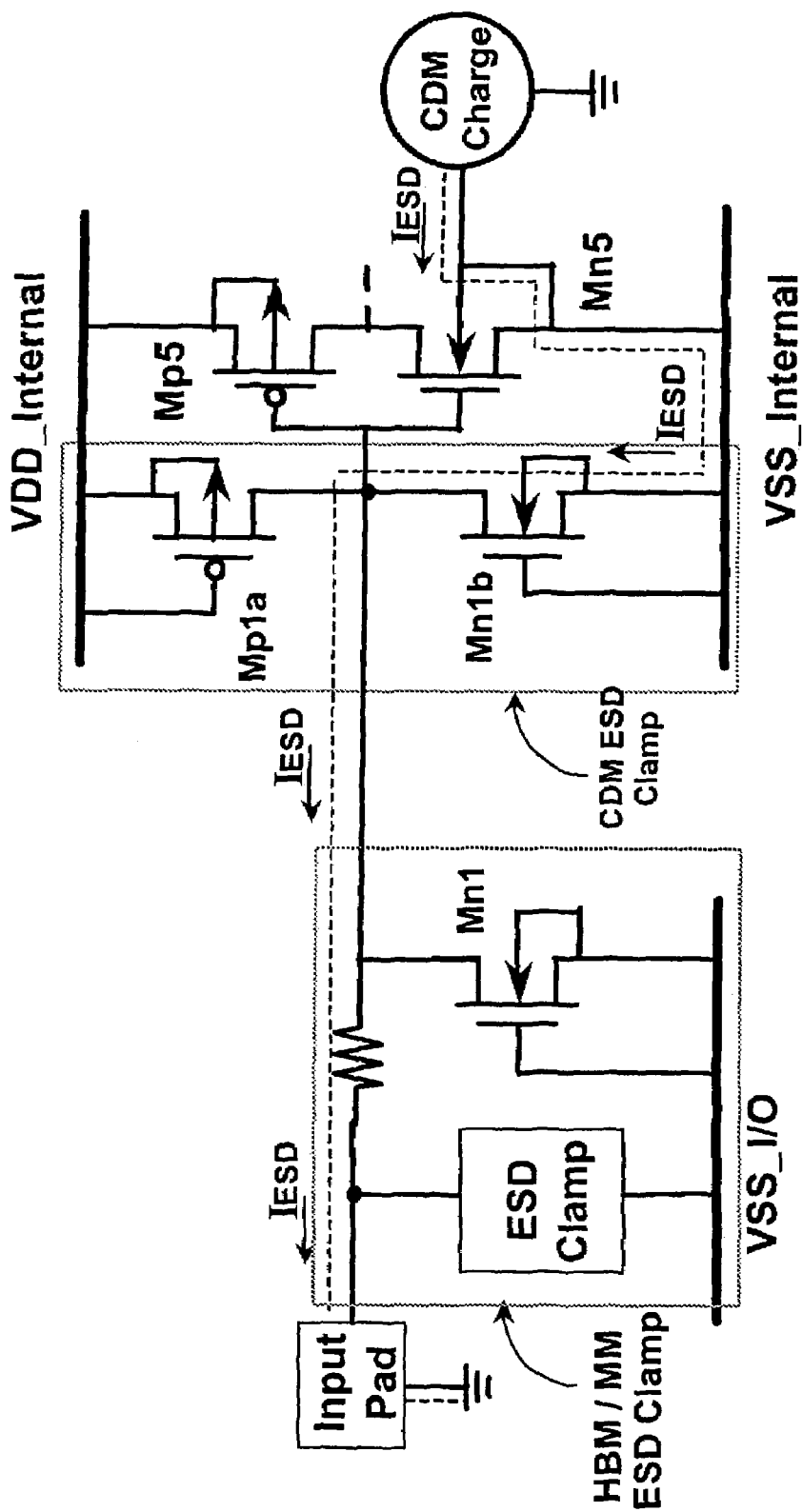
FIG. 3 shows a circuit diagram of a conventional ESD protection scheme.
Figure 4:
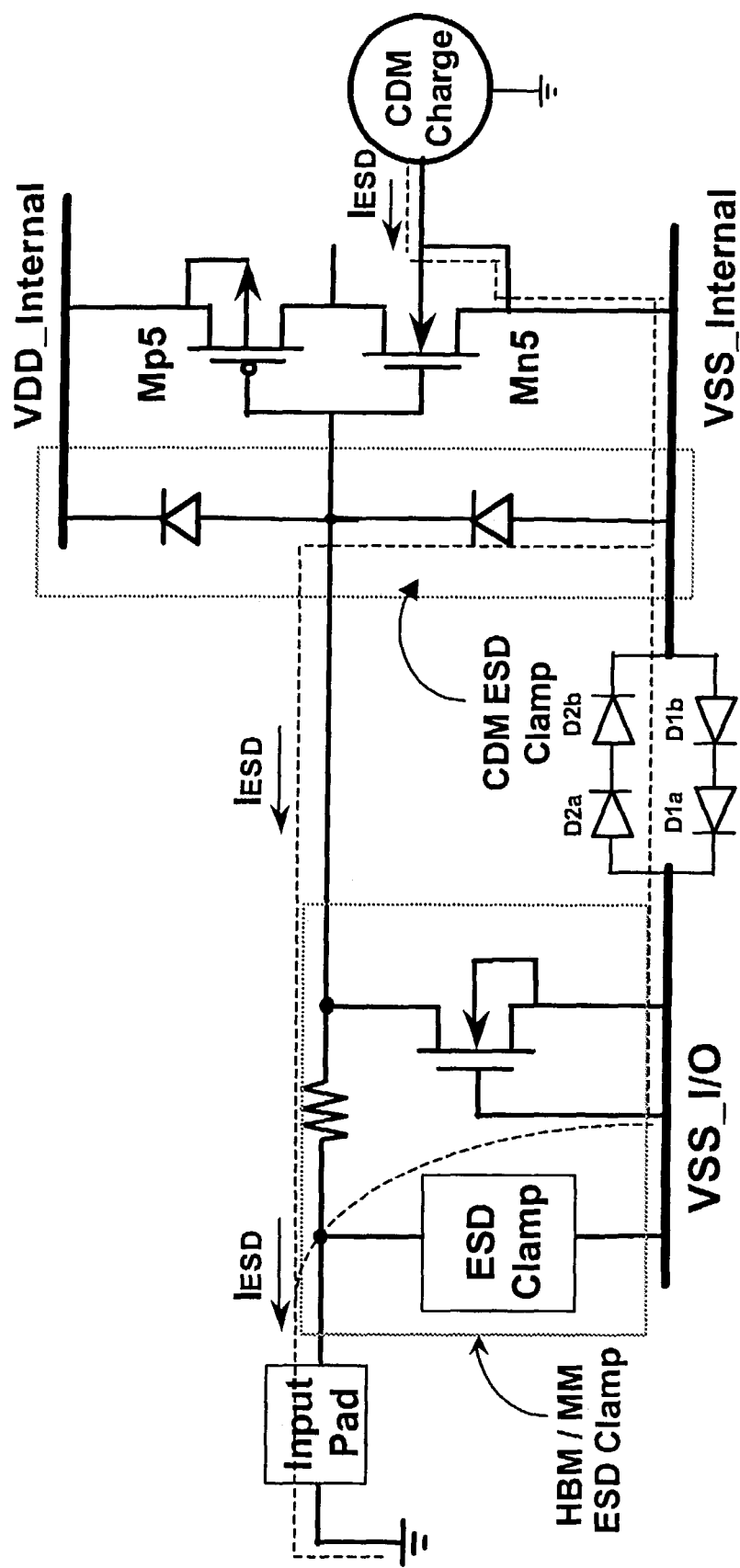
FIG. 4 shows a circuit diagram of another conventional ESD protection scheme.
Figure 5:
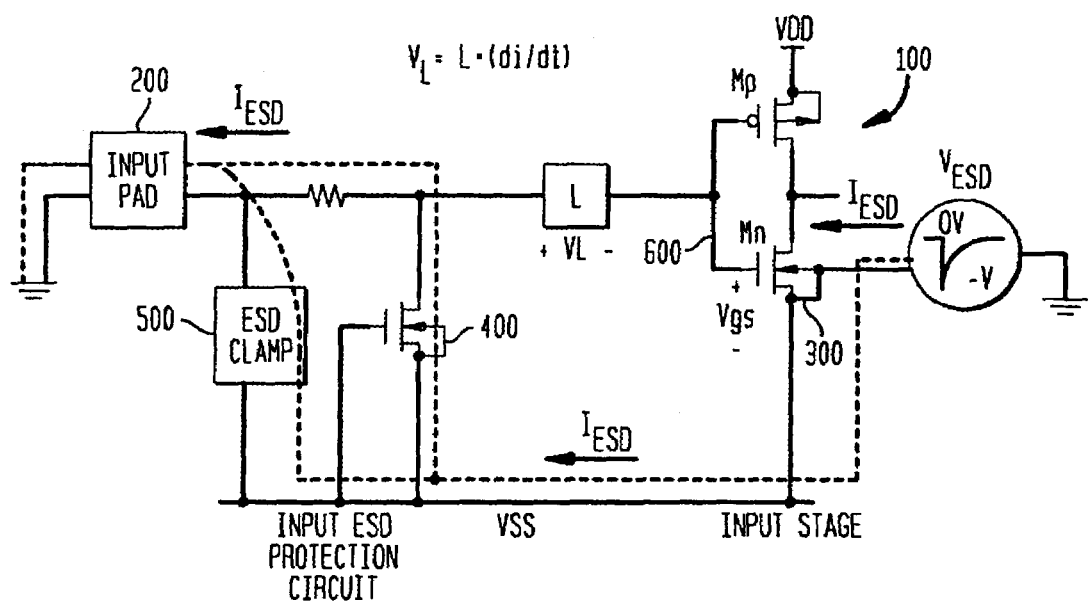
FIG. 5 shows a circuit diagram of still another conventional ESD protection scheme.
Figure 6A:
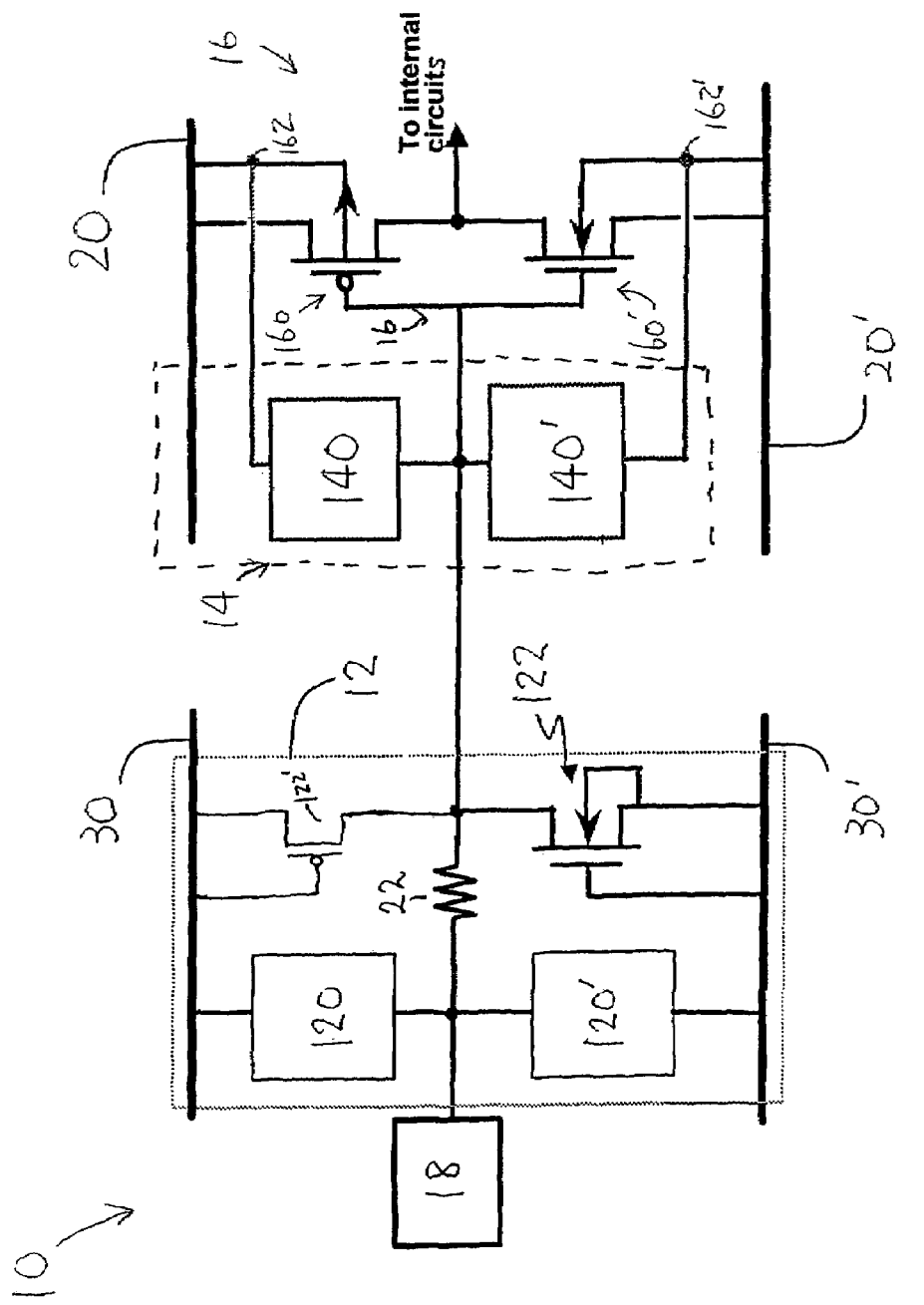
FIG. 6A shows a circuit diagram for ESD protection in accordance with one embodiment of the present invention.

FIG. 6A shows a circuit 10 for ESD protection in accordance with one embodiment of the present invention. Referring to FIG. 6A, the circuit 10 includes an HBM/MM ESD protection circuit 12 and a CDM ESD protection circuit 14. CDM ESD protection circuit 14 includes a first CDM clamp 140 for protecting a CMOS device 16 from a CDM ESD event. CDM clamp 140 is coupled to a contact pad 18 through a resistor 22 provided in ESD protection circuit 12 and a substrate 162 of a PMOS transistor 160 of CMOS device 16 such that electrostatic charges accumulated in substrate 162 of PMOS transistor 160 may be quickly conducted by CDM clamp 140 to contact pad 18 during a CDM ESD event. In one embodiment, contact pad 18 is an input pad. In one embodiment, substrate 162 may include a base, a bulk or a semiconductor well. Substrate 162 of PMOS transistor 160 is also coupled to a first high voltage line 20, for example, $V_{DD}$ for internal circuits.

CDM ESD protection circuit 14 also includes a second CDM clamp 140' coupled to contact pad 18 through resistor 22 and a substrate 162' of an NMOS transistor 160' of CMOS device 16 such that electrostatic charges accumulated in substrate 162' of NMOS 160' may be quickly conducted by CDM clamp 140' to contact pad 18 because CDM clamp 140' is normally "on" under ESD stress conditions. Substrate 162' of NMOS transistor 160' is also coupled to a first low voltage line 20', for example, $V_{SS}$ for internal circuits.

To quickly conduct a CDM current, CDM clamps 140 and 140' are preferably low threshold-voltage devices. A low threshold-voltage device is an "initial-on" element without a breakdown mechanism, and therefore is able to quickly respond in an ESD event. Each of CDM clamps 140 and 140' of the present invention includes at least one active device. As a result, an additional bias voltage is required to turn off the CDM clamps of the present invention during normal operations of the integrated circuit. In one embodiment, an additional circuit may be required to generate the additional bias voltage in the integrated circuit within which the CDM clamps are provided.

An active device generally refers to a metal-oxide-semiconductor ("MOS") transistor that is able to quickly turn on, or is "initial-on" to conduct an ESD current during an ESD event. The active device has a lightly-doped region formed between a source and a drain region of the transistor and therefore has a low threshold voltage, specifically, a zero or negative threshold voltage for n-type active devices, and a zero or positive threshold voltage for p-type active devices. An n-type active device refers to an electrostatic discharge protection device comprising a p-type substrate, an n-type source region, an n-type drain region, a gate, and a lightly doped p-type region formed between the source and drain regions and under the gate. A negative voltage, i.e., smaller than $V_{SS}$, is needed to turn off the n-type active device. A p-type active device refers to an electrostatic discharge protection device comprising an n-type substrate, an p-type source region, an p-type drain region, a gate, and a lightly doped n-type region formed between the source and drain regions and under the gate. A positive voltage greater $V_{DD}$, is needed to turn off the p-type active device.

The active devices have the advantages of being able to quickly respond to an ESD event with strong ESD robustness. Additional details about active devices are discussed in the related U.S. patent application to Ker et al, U.S. patent application Ser. No. 10/230,055, entitled "ELECTROSTATIC DISCHARGE PROTECTION DEVICE AND METHOD OF MANUFACTURING THE SAME," filed on Aug. 29, 2002.

Referring again to FIG. 6A, HBM/MM ESD protection circuit 12 includes a primary circuit (not numbered) having HBM/MM clamps 120 and 120', and a secondary circuit (not numbered) having HBM/MM clamps 122 and 122'. In one embodiment, clamps 120 and 120' are one of long-channel NMOS, field oxide devices, lateral bipolar transistors, or lateral silicon controlled rectifier ("SCR") devices, and clamps 122 and 122' are short-channel, thin gate oxide NMOS. In operation, during an HBM/MM ESD event, since the primary circuit generally has a larger trigger voltage than the secondary circuit, the secondary circuit enters a snapback region first to clamp an ESD voltage level across the gate oxide of PMOS 160. Thereafter, an increase in a voltage drop across resistor 22 triggers the primary circuit to conduct an ESD current. Clamp 120 of HBM/MM ESD protection circuit 12 is coupled between resistor 22 and a second high voltage line 30, for example, $V_{DD}$ for input/output (I/O) circuits, and clamp 120' is coupled between resistor 22 and a second low voltage line 30', for example, $V_{SS}$ for I/O circuits. In one embodiment, first high voltage line 20 has a different voltage level from second high voltage line 30, and first low voltage line 20' has a different voltage level from second low voltage line 30'.

Figure 6B:
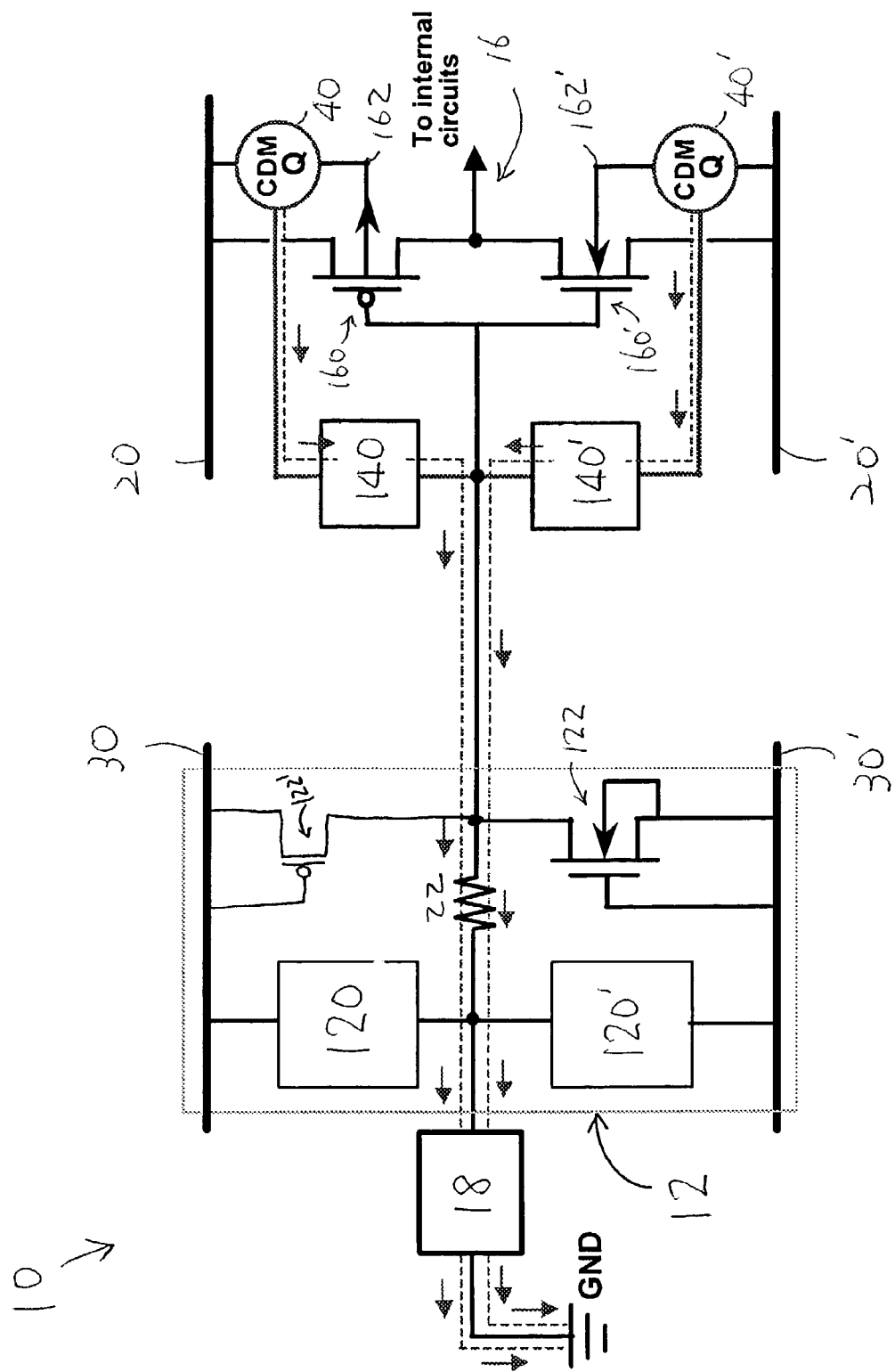
FIG. 6B shows a discharge path for the circuit shown in FIG. 6A.

FIG. 6B shows a discharge path for circuit 10 shown in FIG. 6A during a CDM ESD event. Referring to FIG. 6B, electrostatic charges 40 accumulated in substrate 162 of PMOS transistor 160 are conducted by CDM clamp 140 to contact pad 18, which is grounded. Likewise, electrostatic charges 40' accumulated in substrate 162' of NMOS transistor 160' are conducted by CDM clamp 140' to contact pad 18, which is grounded.

Figure 6C:
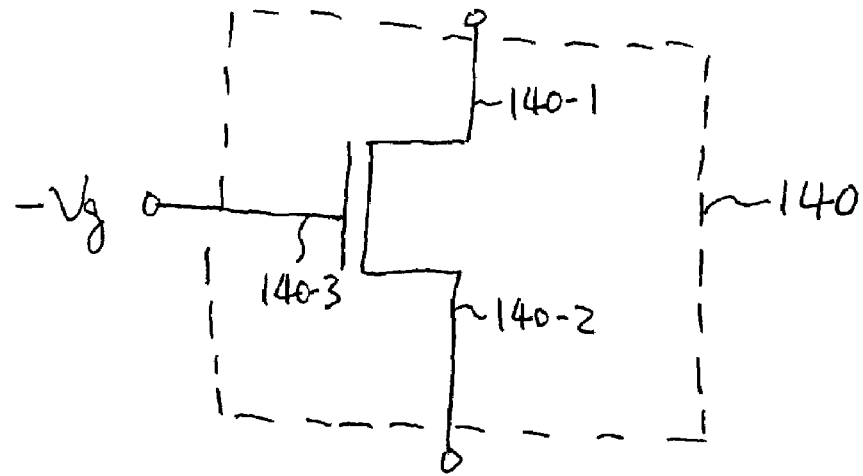
FIG. 6C shows an embodiment of a CDM clamp consistent with the present invention.

FIG. 6C shows an embodiment of a CDM clamp consistent with the present invention. Specifically, FIG. 6C shows an n-type CDM clamp 140 having a drain 140-1, a source 104-2, and a gate 104-3. By applying a negative voltage, $-V_g$, to gate 104-3, leakage current from drain 104-1 and source 104-2 is suppressed during normal operating conditions. During ESD stress conditions, n-type CDM clamp 140 provides an "initial on" path to conduct the ESD current.

Figure 6D:
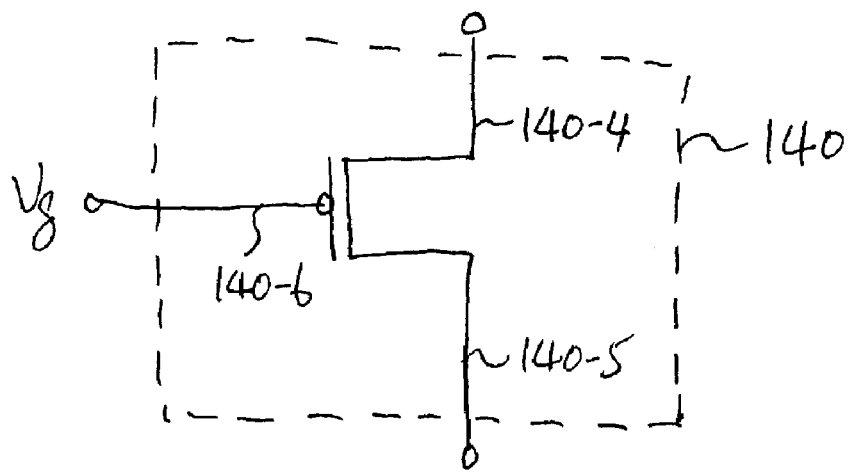
FIG. 6D shows another embodiment of a CDM clamp consistent with the present invention.

FIG. 6D shows an embodiment of a CDM clamp consistent with the present invention. Specifically, FIG. 6D shows a p-type CDM clamp 140 having a drain 140-4, a source 104-5, and a gate 104-6. By applying a positive voltage, $V_g$, to gate 104-6, leakage current from drain 104-4 and source 104-5 is suppressed during normal operating conditions. During ESD stress conditions, p-type CDM clamp 140 provides an "initial on" path to conduct the ESD current.

The exemplary CDM clamps shown and describe above may be incorporated in any embodiment of the present invention.

Figure 7A:
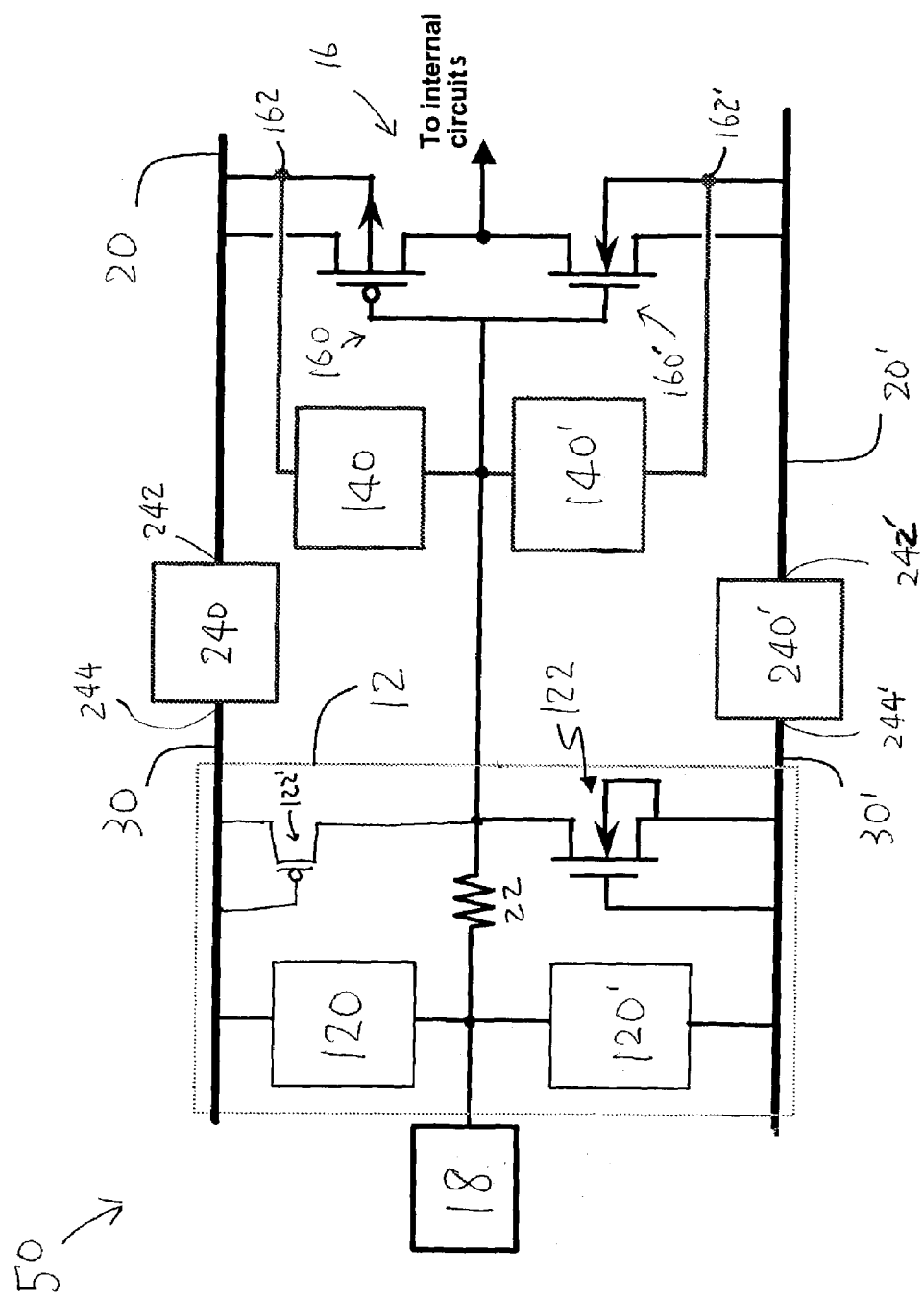
FIG. 7A shows a circuit diagram for ESD protection in accordance with one embodiment of the present invention.

FIG. 7A shows a circuit 50 for ESD protection in accordance with one embodiment of the present invention. Referring to FIG. 7A, circuit 50 is the same as circuit 10 shown in FIG. 6A except the incorporation of CDM clamps 240 and 240'. CDM clamp 240 has a first terminal 242 coupled to substrate 162 of PMOS transistor 160 through first high voltage line 20, and a second terminal 244 coupled to contact pad 18 through second high voltage line 30 and clamp 120. In one embodiment, CDM clamp 240 is an active device having a low threshold voltage. In another embodiment, CDM clamp 240 is a bi-directional silicon diode. A bi-directional silicon diode refers to an integrated circuit device that includes a semiconductor substrate, a well region formed inside the semiconductor substrate, a first isolation structure formed inside the well region, a second isolation structure formed inside the well region and spaced apart from the first isolation structure, a dielectric layer formed over the well region, and a layer of silicon, formed over the dielectric layer, including a p-type portion, an n-type portion and a center portion disposed between the p-type and n-type portions. Additional details about the bi-directional silicon diode are discussed in related U.S. patent application to Chyh-Yih Chang et al, Ser. No. 09/749,377 entitled "SUBSTRATE-BIASED SILICON DIODE FOR ELECTROSTATIC DISCHARGE PROTECTION AND FABRICATION METHOD," filed on 28 Dec. 2000, and assigned to the common assignee of the present application.

Referring again to FIG. 7A, CDM clamp 240' has a first terminal 242' coupled to substrate 162' of NMOS transistor 160' through first low voltage line 20', and a second terminal 244' coupled to contact pad 18 through second low voltage line 30' and clamp 120'. In one embodiment, CDM clamp

240' is an active device having a low threshold voltage. In another embodiment, CDM clamp 240' is a bi-directional silicon diode.

Figure 7B:
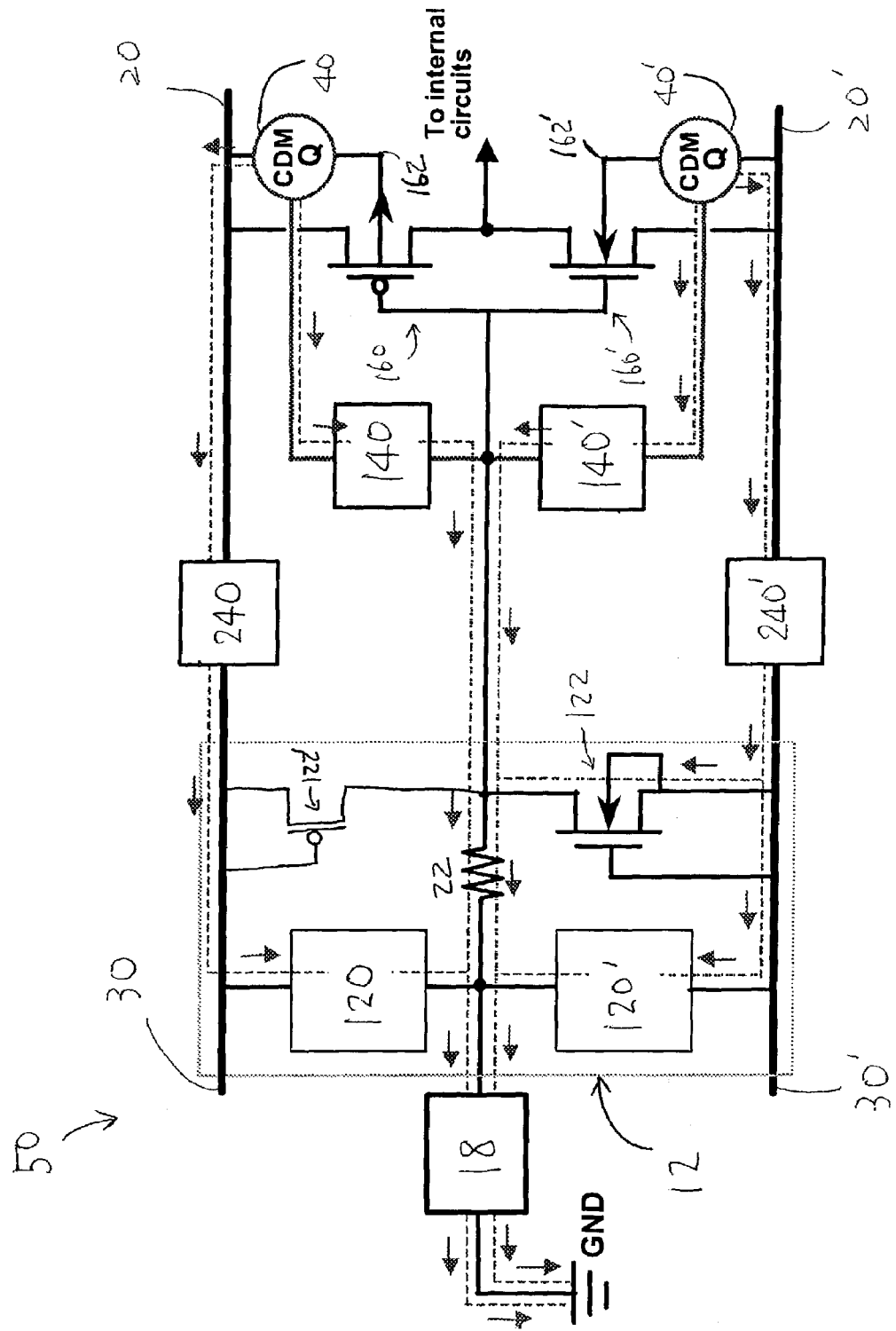
FIG. 7B shows a discharge path for the circuit shown in FIG. 7A.

FIG. 7B shows a discharge path for circuit 50 shown in FIG. 7A during a CDM ESD event. Referring to FIG. 7B, as contact pad 18 is grounded, electrostatic charges 40 accumulated in substrate 162 of PMOS transistor 160, in addition to being conducted by CDM clamp 140 to contact pad 18 through a resistor 22, may be conducted by CDM clamp 240 to contact pad 18 through first high voltage line 20, second high voltage line 30, and clamp 120. Likewise, as contact pad 18 is grounded, electrostatic charges 40' accumulated in substrate 162' of NMOS transistor 160', in addition to being conducted by CDM clamp 140' to contact pad 18 through resistor 22, may be conducted by CDM clamp 240' to contact pad 18 through first low voltage line 20', second low voltage line 30', and clamp 120'. Therefore, CDM clamps 240 and 240' function to provide additional ESD discharge paths to provide a robust ESD protection scheme.

Figure 8:
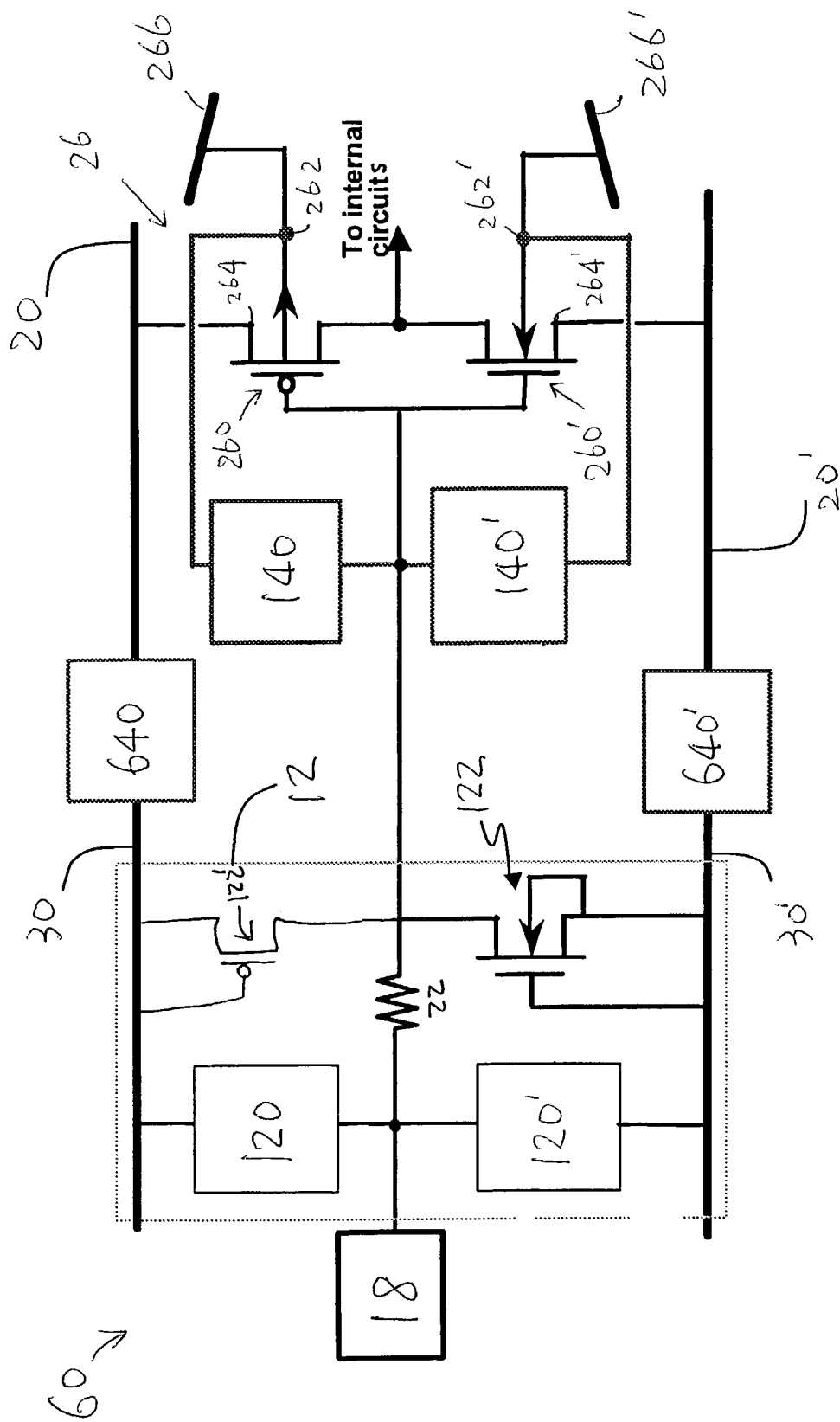
FIG. 8 shows a circuit diagram for ESD protection in accordance with one embodiment of the present invention.

FIG. 8 shows a circuit 60 for ESD protection in accordance with one embodiment of the present invention. Referring to FIG. 8, circuit 60 is similar to circuit 50 shown in FIG. 7A except that, for example, a CMOS device 26 having high reliability characteristics is incorporated. The additional p-well and n-well bias on the bulk of NMOS and PMOS transistors, respectively, serve to eliminate substrate noise. Specifically, CMOS device 26 includes a PMOS transistor 260 having a diffused region 264 coupled to first high voltage line 20, and a substrate 262 biased by a bias source 266. In the embodiment, substrate 262 is an N-well. CDM clamp 140 is coupled between substrate 262 and contact pad 18 through resistor 22 to conduct electrostatic charges accumulated in biased N-well 262 of PMOS transistor 260 to contact pad 18 during a CDM ESD event. CMOS device 26 also includes an NMOS transistor 260' having a diffused region 264' coupled to first low voltage line 20', and a substrate 262' biased by a bias source 266'. In the embodiment, substrate 262' is a P-well. CDM clamp 140' is coupled between substrate 262' and contact pad 18 through resistor 22 to conduct electrostatic charges accumulated in biased p-well 262' of NMOS transistor 260' to contact pad 18 during a CDM ESD event.

In one embodiment, circuit 60 also includes CDM clamp 640 and 640'. CDM clamp 640 is coupled between first high voltage line 20 and second high voltage line 30, in which first high voltage line 20 may have a different voltage level from second high voltage line 30. CDM clamp 640' is coupled between first low voltage line 20' and second low voltage line 30', in which first low voltage line 20' may have a different voltage level from second low voltage line 30'. In the above embodiments, CDM clamps 640 and 640' connect the voltage lines of different levels and create additional paths to conduct the ESD current away from the internal circuits.

Figure 9:
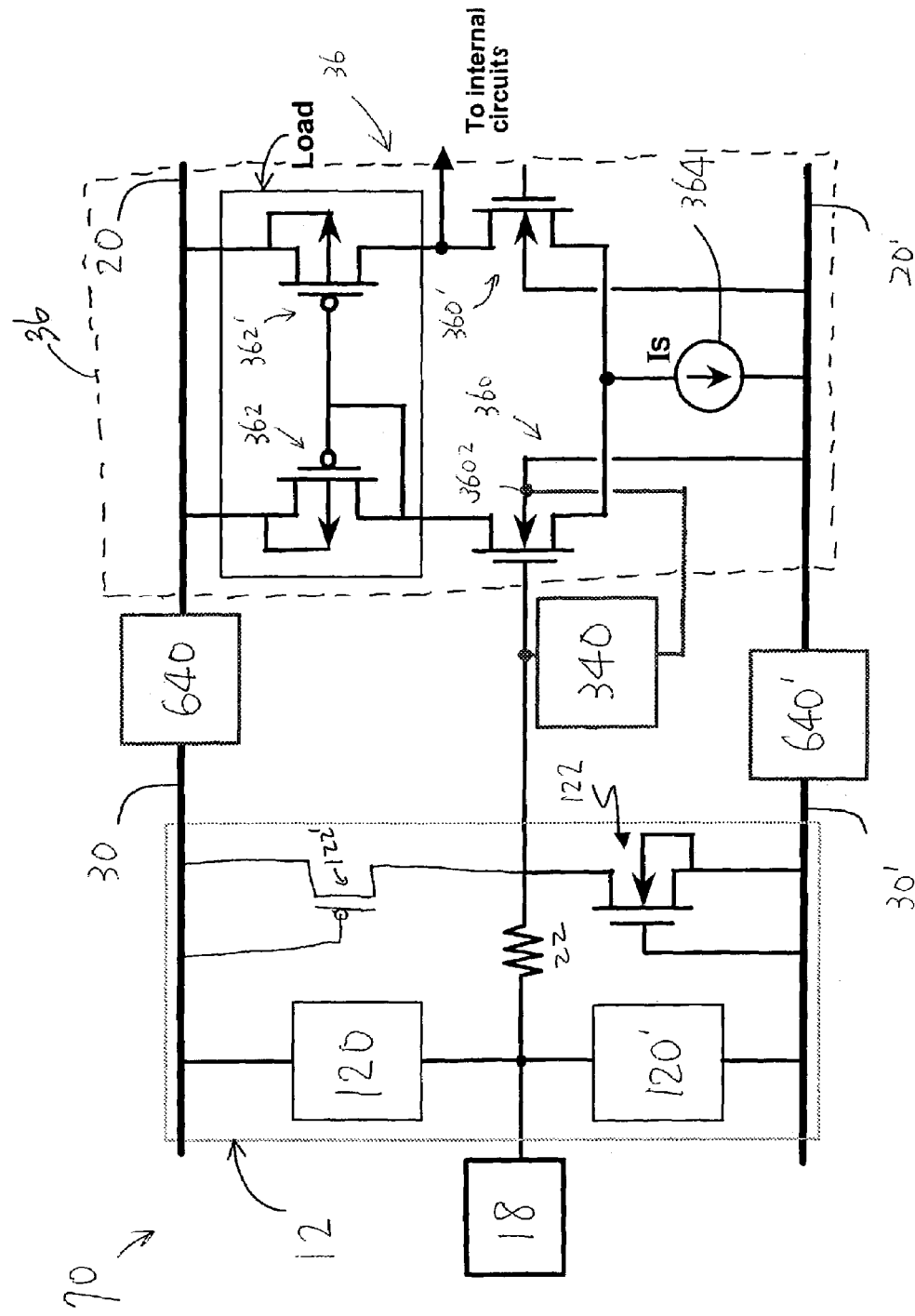
FIG. 9 shows a circuit diagram for ESD protection in accordance with one embodiment of the present invention.

FIG. 9 shows a circuit 70 for ESD protection in accordance with one embodiment of the present invention. Referring to FIG. 9, circuit 70 is similar to circuit 60 shown in FIG. 8 except that, for example, a differential amplifier 36 is incorporated. MOS device 36 includes a master stage of NMOS transistors 360 and 360', a slave stage of PMOS transistors 362 and 362', and a current source 364. Circuit 70 also includes a CDM clamp 340 coupled between a substrate 366 of NMOS transistor 360 and contact pad 18 through resistor 22 to conduct electrostatic charges accumulated in substrate 366 of NMOS transistor 360 to contact pad 18 during a CDM ESD event.

Figure 10A:
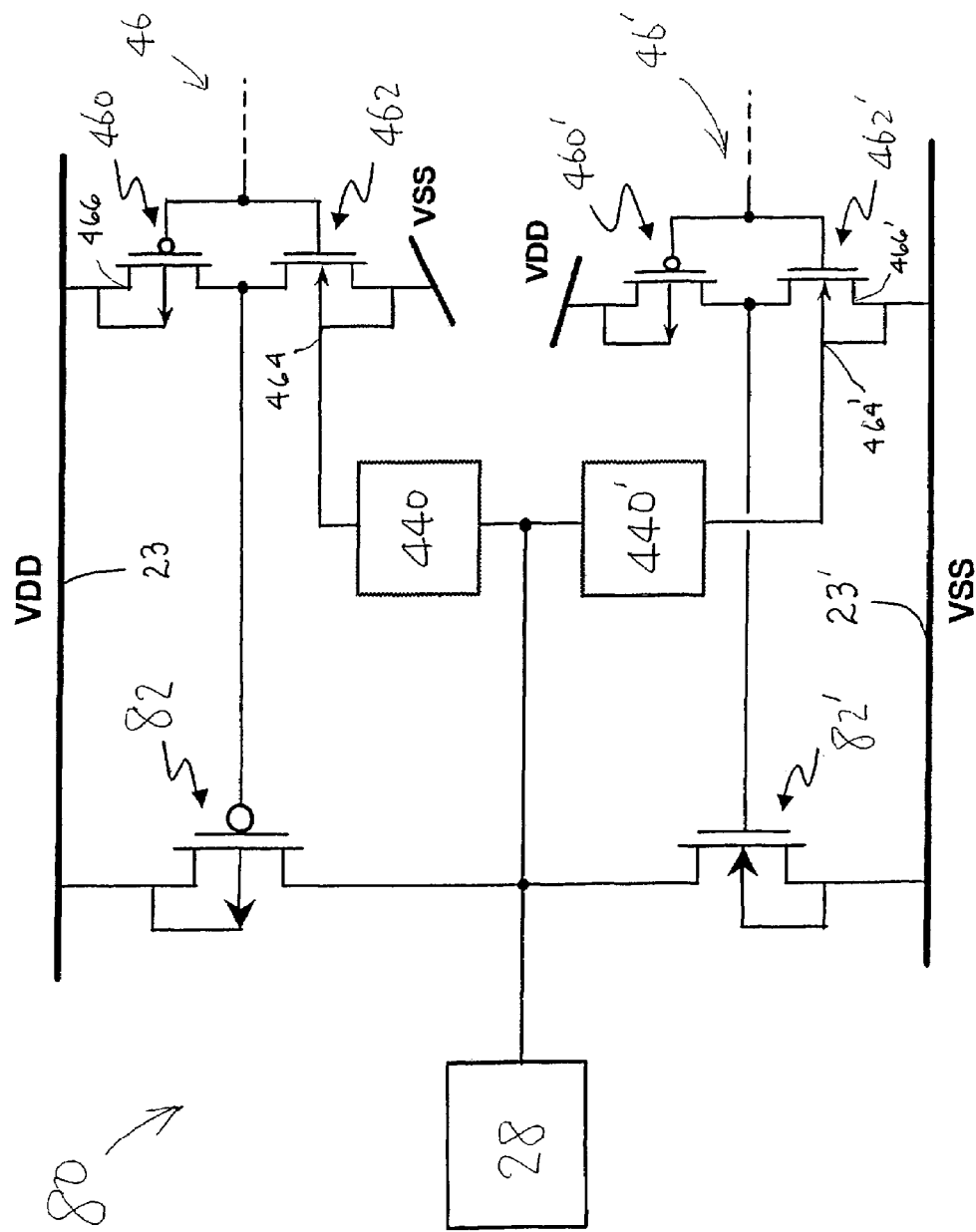
FIG. 10A shows a circuit diagram for ESD protection in accordance with one embodiment of the present invention.

FIG. 10A shows an output circuit 80 for ESD protection in accordance with one embodiment of the present invention. Referring to FIG. 10A, circuit 80, fabricated in a p-type substrate 464 or 464', includes a contact pad 28, a PMOS transistor 82, a CMOS device 46 and a CDM clamp 440. PMOS transistor 82 serves as a buffer to circuit 80. CMOS device 46 serves as a pre-driver and includes a PMOS transistor 460 and an NMOS transistor 462. CDM 440 is coupled between substrate 464 of NMOS transistor 462 and contact pad 28. PMOS transistor 460 includes a diffused region 466 coupled to a high voltage line 23, for example, $V_{DD}$ line.

Circuit 80 also includes a buffer NMOS transistor 82', a CMOS device 46' and a CDM clamp 440'. CMOS device 46' serves as a pre-driver and includes a PMOS transistor 460' and an NMOS transistor 462'. CDM 440' is coupled between contact pad 28 and a substrate 464' of NMOS transistor 462'. NMOS transistor 462' has a diffused region 466' coupled to a low voltage line 23', for example, $V_{SS}$ line.

Figure 10B:
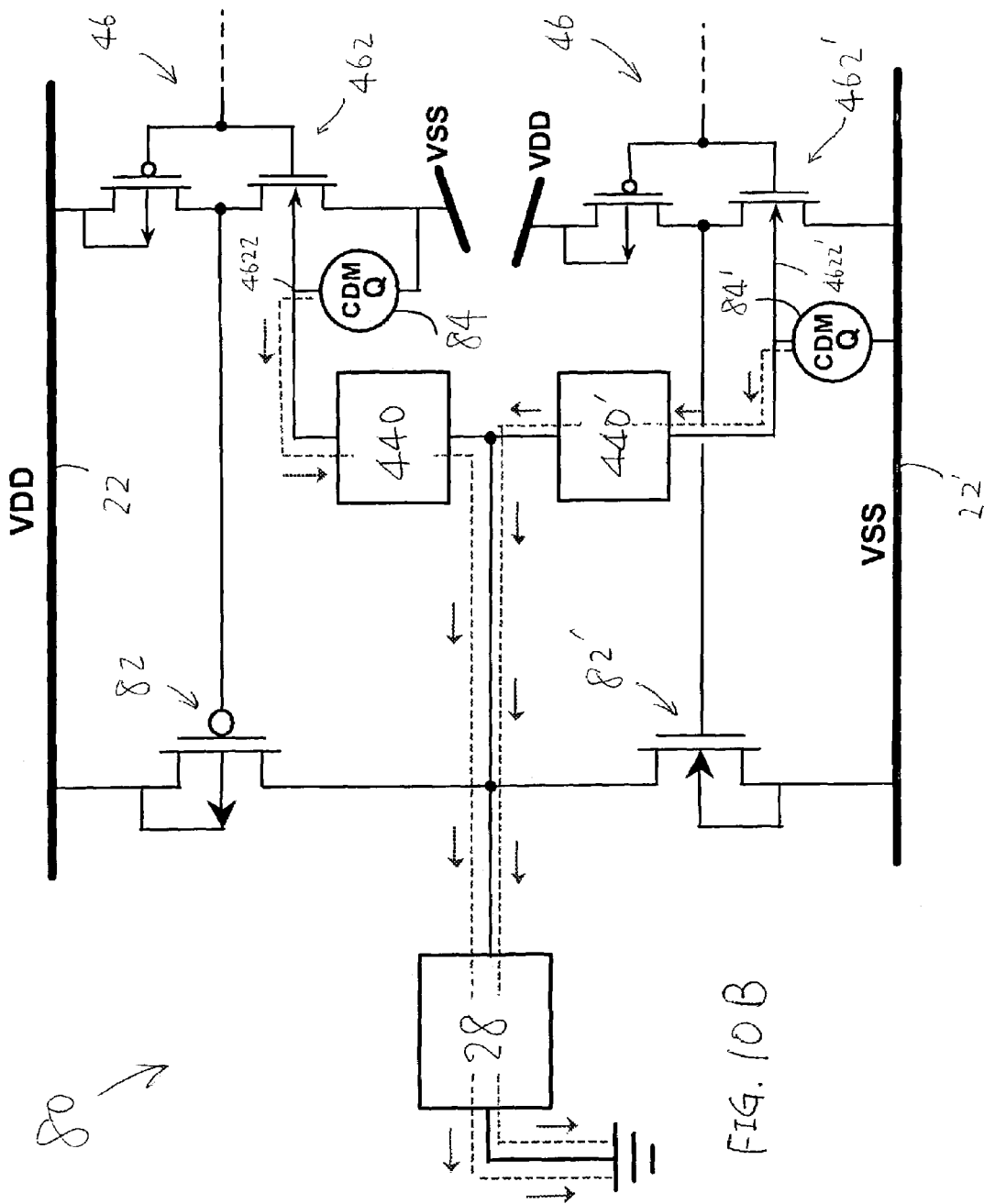
FIG. 10B shows a discharge path for the circuit shown in FIG. 10A.

FIG. 10B shows a discharge path for circuit 80 shown in FIG. 10A. Referring to FIG. 10B, during a CDM ESD event, electrostatic charges 84 accumulated in substrate 464 of NMOS transistor 462 are conducted by CDM clamp 440 to contact pad 28. Likewise, during a CDM ESD event, electrostatic charges 84' accumulated in substrate 464' of NMOS transistor 462' are conducted by CDM clamp 440' to contact pad 28. In each instance, contact pad 28 is coupled to ground.

Figure 11A:
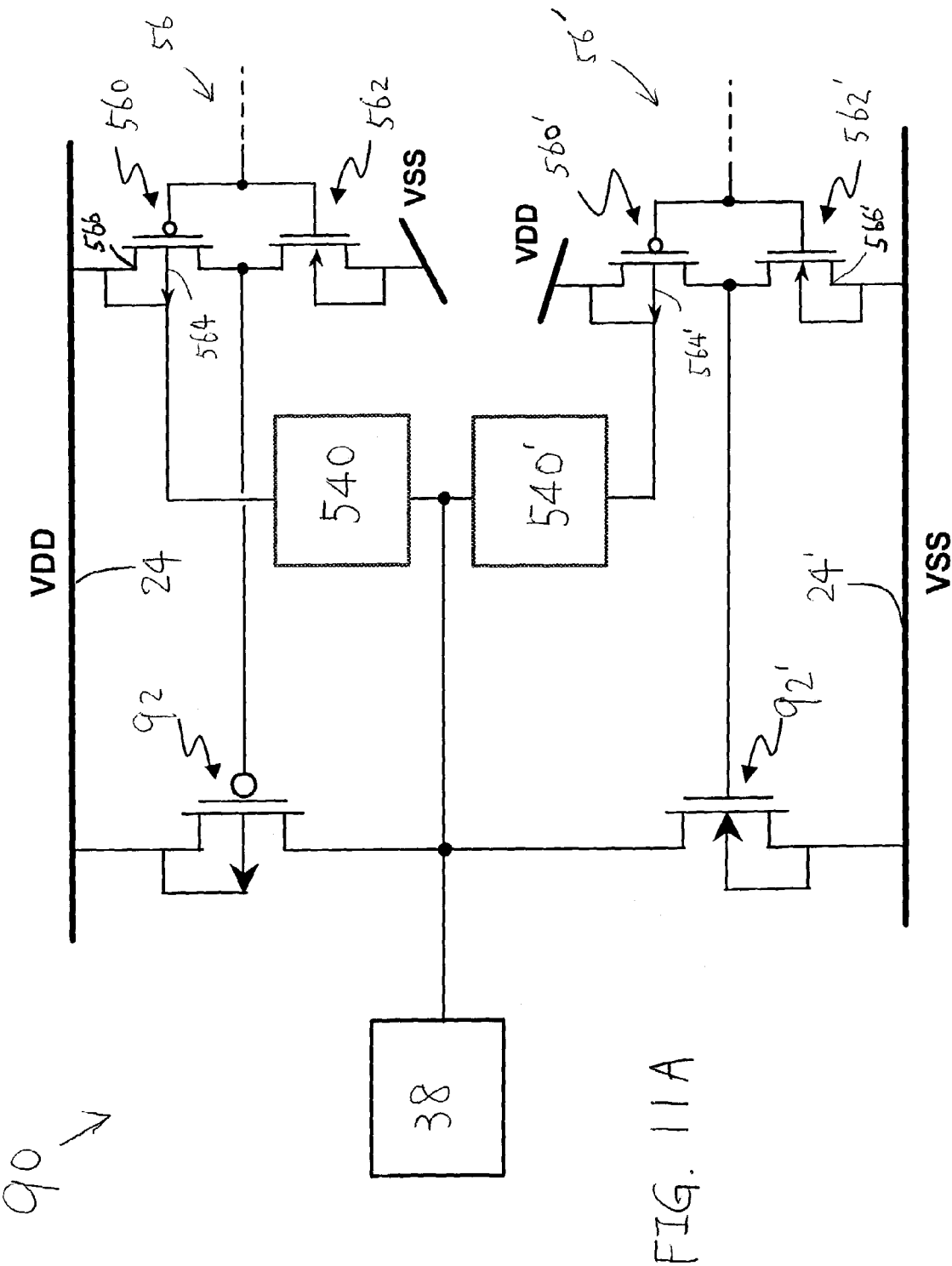
FIG. 11A shows a circuit diagram for ESD protection in accordance with one embodiment of the present invention.

FIG. 11A shows an output circuit 90 for ESD protection in accordance with one embodiment of the present invention. Referring to FIG. 11A, circuit 90 fabricated in an n-type substrate 564 or 564' includes a contact pad 38, a PMOS transistor 92, a CMOS device 56 and a CDM clamp 540. PMOS transistor 92 serves as a buffer transistor for circuit 90. CMOS device 56 serves as a pre-driver and includes a PMOS transistor 560 and an NMOS transistor 562. CDM clamp 540 is coupled between contact pad 38 and substrate 564 of PMOS transistor 560. PMOS transistor 560 includes a diffused region 566 coupled to a high voltage line 24, for example, $V_{DD}$ line.

Circuit 90 also includes a buffer NMOS transistor 92', a CMOS device 56' and a CDM clamp 540'. CMOS device 56' serves as a pre-driver and includes a PMOS transistor 560' and an NMOS transistor 562'. CDM clamp 540' is coupled between contact pad 38 and substrate 564' of PMOS transistor 560'. NMOS transistor 562' has a diffused region 566' coupled to a low voltage line 24', for example, $V_{SS}$ line.

Figure 11B:
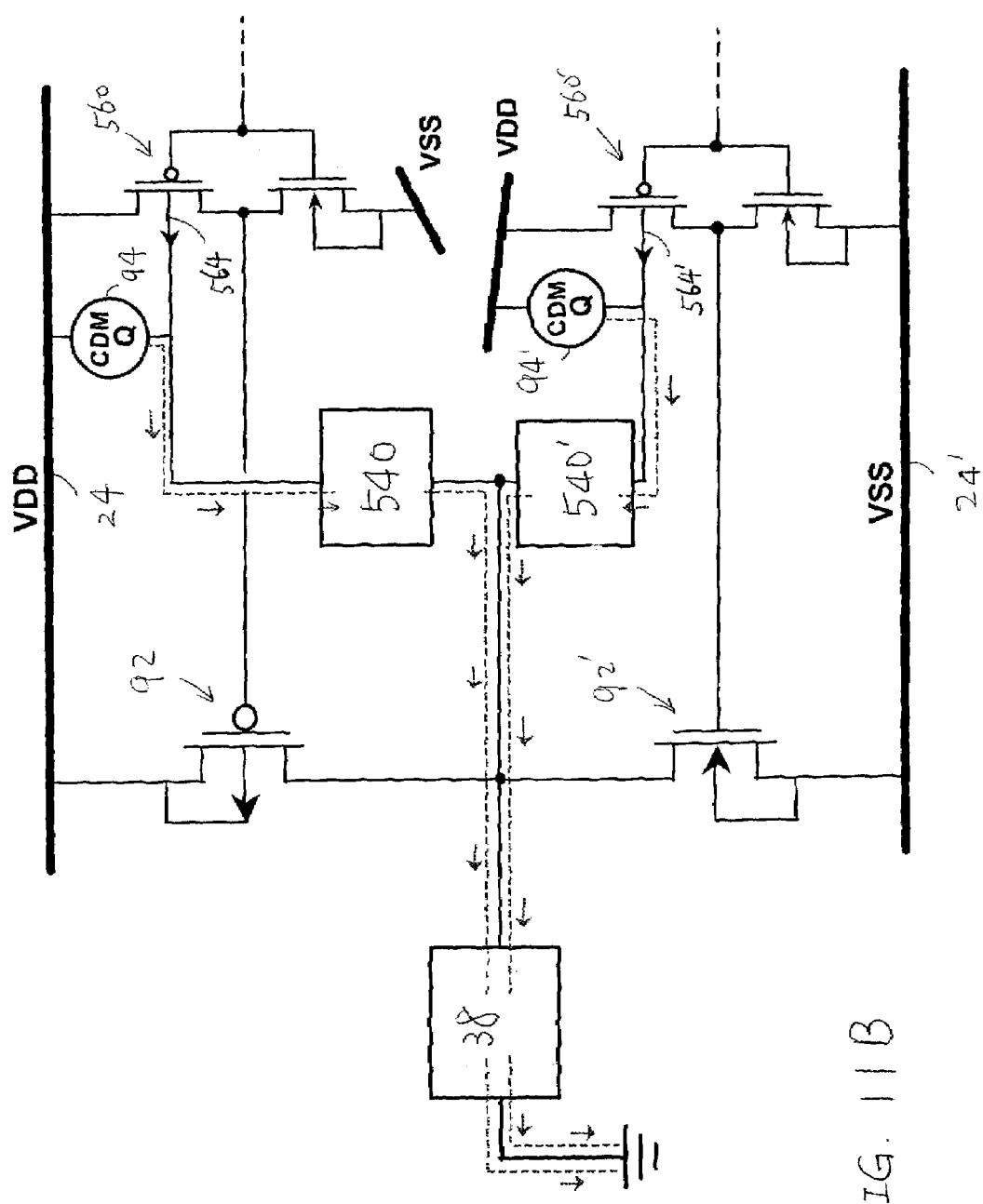
FIG. 11B shows a discharge path for the circuit shown in FIG. 11A.

FIG. 11B shows a discharge path for circuit 90 shown in FIG. 11A. Referring to FIG. 11B, during a CDM ESD event, electrostatic charges 94 accumulated in substrate 564 of PMOS transistor 560 are conducted by CDM clamp 540 to contact pad 38. Likewise, during a CDM ESD event, electrostatic charges 94' accumulated in substrate 564' of PMOS transistor 560' are conducted by CDM clamp 540' to contact pad 38. Contact pad 38 in both instances is coupled to ground.

Figure 12:
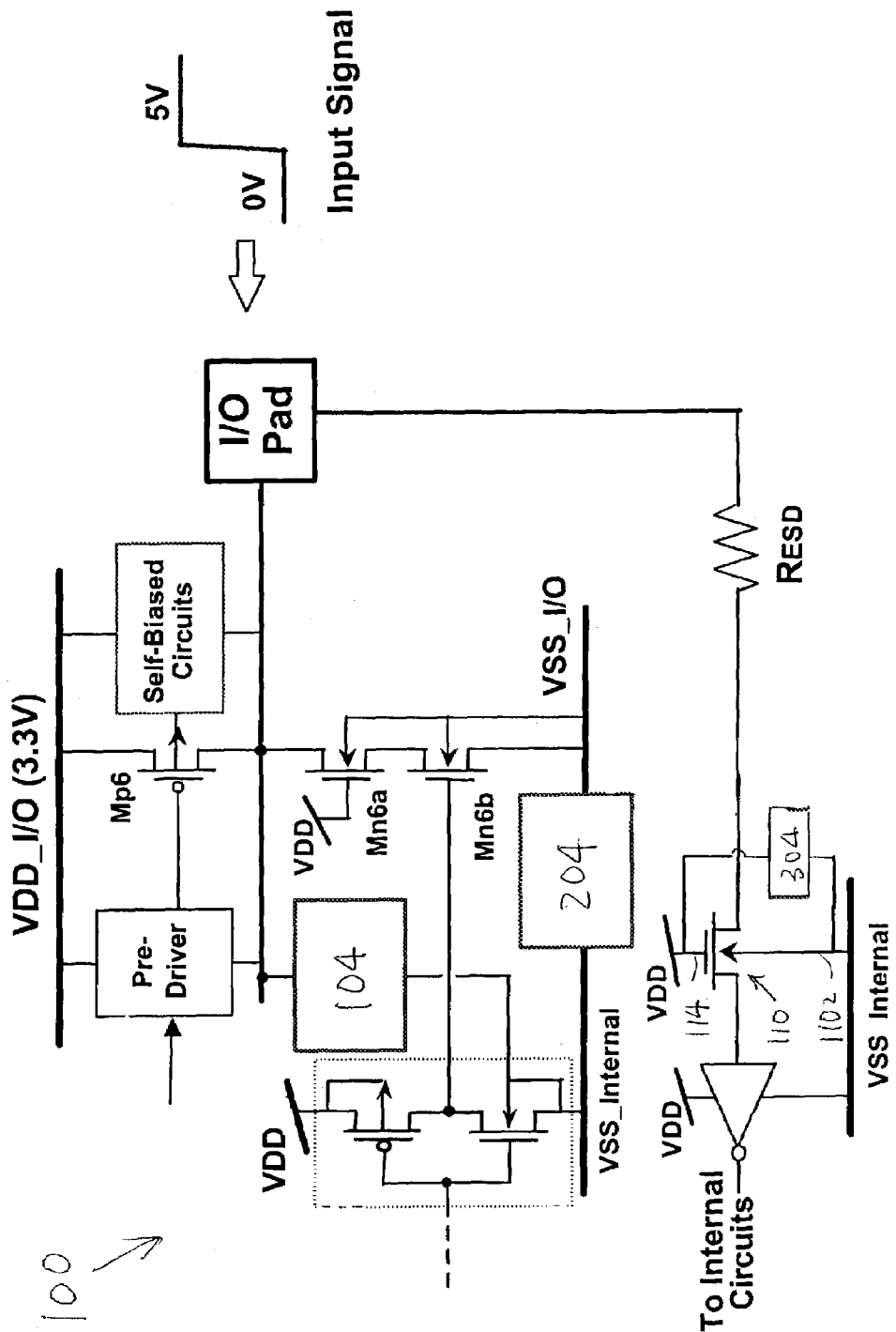
FIG. 12 shows a circuit scheme for ESD protection in accordance with one embodiment of the present invention.

FIG. 12 shows a circuit 100 for ESD protection in accordance with one embodiment of the present invention. Referring to FIG. 12, circuit 100 is a high voltage tolerant I/O circuit, for example, a 3V/5V tolerant I/O circuit. Circuit 100 includes CDM clamps 104, 204 and 304 for CDM ESD protection. CDM clamp 104 provides the same functions as CDM clamp 440 shown in FIG. 10A, and therefore will not be discussed further. CDM clamp 204 provides the same functions as CDM clamp 204 shown in FIG. 7A or CDM clamp 640' shown in FIG. 9, and therefore will not be discussed further. CDM clamp 304 is coupled between a substrate 112 and a gate 114 of a transistor 110. Gate 114 of transistor 110 is coupled to a high voltage line, $V_{DD}$, and substrate 112 of transistor 110 is coupled to a low voltage line, $V_{SS}$. In operation, in one embodiment, transistor 110 serves as a transmission gate. During a CDM ESD event, CDM clamp 304 conducts electrostatic charges accumulated in substrate 112 to low voltage line $V_{SS}$ or high voltage line $V_{DD}$.

The present invention therefore also provides a method for electrostatic discharge protection. In one embodiment, the method includes providing a CDM clamp coupled between a contact pad and a substrate of a transistor, in which the CDM clamp includes at least one active device, and conducting electrostatic charges accumulated in the substrate of the transistor to the contact pad as the contact pad is grounded.

In another embodiment, the method includes providing a CDM protection circuit comprising a CDM clamp coupled between a contact pad and a substrate of a transistor, in which the CDM clamp is an active device, providing an HBM/MM protection circuit disposed between the contact pad and the CDM protection circuit comprising at least one HBM/MM clamp coupled to the contact pad, and conducting electrostatic charges accumulated in the substrate of the transistor to the contact pad as the contact pad is grounded.

In still another embodiment, the method includes providing a transistor having a gate coupled to a first voltage line, and a substrate coupled to a second voltage line, providing a CDM clamp coupled between the gate and substrate of the transistor, and conducting electrostatic charges accumulated in the substrate of the transistor to one of the first or second voltage line during an ESD event.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An integrated circuit for providing electrostatic discharge protection, comprising:
   a contact pad;
   a CMOS device including a transistor having a substrate; and
   a CDM clamp for providing electrostatic discharge protection coupled in series between the contact pad and the CMOS device, the CDM clamp including at least one active device, wherein the CDM clamp conducts electrostatic charges accumulated in the substrate of the transistor to the contact pad and wherein the CMOS device is coupled between a high voltage line and a low voltage line, and
   wherein the at least one active device is a transistor having a source, a drain, and a biased gate, and the gate is not in electrical connection with either the source or the drain.

2. The circuit of claim 1, wherein the CDM clamp includes at least one n-type active device having one of low, zero, or negative threshold voltage.

3. The circuit of claim 1, wherein the CDM clamp includes at least one p-type active device having one of low, zero, or positive threshold voltage.

4. The circuit of claim 1, wherein the transistor is a PMOS transistor having a diffused region coupled to the high voltage line and a substrate coupled to the CDM clamp and the high voltage line.

5. The circuit of claim 1, wherein the transistor is an NMOS transistor having a diffused region coupled to the low voltage line and a substrate coupled to the CDM clamp and the low voltage line.

6. The circuit of claim 1, wherein the transistor is a PMOS transistor having a diffused region coupled to the high voltage line and a substrate coupled to the CDM clamp and a bias source.

7. The circuit of claim 1, wherein the transistor is an NMOS transistor having a diffused region coupled to the low voltage line and a substrate coupled to the CDM clamp and a bias source.

8. The circuit of claim 1, wherein the CMOS device further comprises a differential amplifier.

9. The circuit of claim 8, wherein the transistor is an NMOS transistor having a gate coupled to the contact pad, and a substrate coupled to the CDM clamp and the low voltage line.

10. The circuit of claim 1, wherein the CMOS device further comprises a pre-driver in an output pad.

11. The circuit of claim 10, wherein the transistor is a PMOS transistor having a diffused region coupled to the high voltage line, and a substrate coupled to the CDM clamp and the high voltage line.

12. The circuit of claim 10, wherein the transistor is an NMOS transistor having a diffused region coupled to the low voltage line, and a substrate coupled to the CDM clamp and the low voltage line.

13. The circuit of claim 1, wherein the CDM clamp coupled between the contact pad and the substrate of the transistor is a first CDM clamp, and the circuit further comprises a second CDM clamp having a first terminal coupled to a first voltage line, and a second terminal coupled to a second voltage line.

14. The circuit of claim 13, wherein the second CDM clamp includes at least one active device.

15. The circuit of claim 13, wherein the second CDM clamp is bi-directional.

16. The circuit of claim 13, wherein the first voltage line has a voltage level different from the second voltage line.

17. The circuit of claim 1, further comprising a first bias source to turn off the CDM clamp.

18. The circuit of claim 13, further comprising a second bias source to turn off the second CDM clamp.

19. The circuit of claim 1, wherein the CDM clamp includes at least one n-type active device.

20. The circuit of claim 19, further comprising a negative bias to turn off the n-type active device.

21. The circuit of claim 1, wherein the CDM clamp includes at least one p-type active device.

22. The circuit of claim 21, further comprising a positive bias to turn off the p-type active device.

23. An integrated circuit, comprising:
   a contact pad;
   a transistor having a substrate;
   a CDM protection circuit comprising a CDM clamp coupled in series between the contact pad and the substrate of the transistor, the CDM clamp including at least one active device; and
   an HBM/MM protection circuit disposed between the contact pad and the CDM protection circuit comprising at least one HBMIMM clamp coupled to the contact pad, wherein the CDM clamp conducts electrostatic charges accumulated in the substrate of the transistor to the contact pad as the contact pad is grounded, and wherein the at least one active device is a transistor having a source, a drain, and a biased gate, and the gate is not in electrical connection with either the source or the drain.

24. The circuit of claim 23, wherein the HBM/MM clamp is one of a field oxide device, lateral bipolar transistor and lateral SCR device.

25. The circuit of claim 23, wherein the CDM clamp coupled between the contact pad and the substrate of the transistor is a first CDM clamp, and the circuit further comprises a second CDM clamp having a first terminal coupled to the substrate of the transistor through a first voltage line, and a second terminal coupled to the contact pad through a second voltage line.

26. A method for providing electrostatic discharge protection, comprising:

providing a contact pad;

grounding the contact pad;

providing a transistor having a substrate;

providing an active device CDM clamp, coupled in series between the contact pad and the substrate of the transistor, the active device CDM clamp being a transistor having a source, a drain, and a gate that is not in electrical connection with either the source or the drain;

biasing the gate of the transistor of the active device CDM clamp;

accumulating electrostatic charges in the substrate of the transistor; and conducting the accumulated electrostatic charges in the substrate of the transistor to the contact pad.

27. The method of claim 26, further comprising:

providing the CDM clamp coupled between the contact pad and the substrate of the transistor as a first CDM clamp;

providing a first voltage line;

providing a second voltage line; and providing a second CDM clamp having a first terminal coupled to the substrate of the transistor through the first voltage line, and a second terminal coupled to the second voltage line.

28. The method of claim 27, further comprising providing a different voltage level between the first voltage line and the second voltage line.

29. A method for providing electrostatic discharge protection, comprising:

providing a contact pad;

providing a transistor having a substrate;

providing a CDM protection circuit including a CDM clamp coupled in series between the contact pad and the substrate of the transistor, the CDM clamp including at least one active device, the at least one active device being a transistor having a source, a drain, and a gate that is not in electrical connection with either the source or the drain;

biasing the gate of the transistor of the at least one active device;

providing an HBM/MM protection circuit disposed between the contact pad and the CDM protection circuit comprising at least one HBM/MM clamp coupled to the contact pad; and conducting electrostatic charges accumulated in the substrate of the transistor to the contact pad as the contact pad is grounded.

30. The method of claim 29, further comprising:

providing the CDM clamp coupled between the contact pad and the substrate of the transistor as a first CDM clamp providing a first voltage line;

providing a second voltage line; and providing a second CDM clamp having a first terminal coupled to the substrate of the transistor through the first voltage line, and a second terminal coupled to the contact pad through the second voltage line.

31. The method of claim 29, further comprising coupling the second CDM clamp to the contact pad through the second voltage line and an HBM/MM clamp of the HBM/MM circuit.

* * * * *